United States Patent
Kuriki et al.

(10) Patent No.: US 7,579,041 B2
(45) Date of Patent: Aug. 25, 2009

(54) METHOD OF MANUFACTURING DIELECTRIC LAYER AND METHOD OF MANUFACTURING LIQUID JET HEAD

(75) Inventors: Akira Kuriki, Nagano-ken (JP); Hironobu Kazama, Nagano-ken (JP); Toshinao Shinbo, Nagano-ken (JP); Koji Sumi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 758 days.

(21) Appl. No.: 10/998,195

(22) Filed: Nov. 29, 2004

(65) Prior Publication Data
US 2005/0208208 A1 Sep. 22, 2005

(30) Foreign Application Priority Data

| Dec. 11, 2003 | (JP) | ............................. 2003-413979 |
| Jun. 29, 2004 | (JP) | ............................. 2004-191435 |
| Sep. 28, 2004 | (JP) | ............................. 2004-282488 |

(51) Int. Cl.
*B05D 5/12* (2006.01)
*H01L 41/22* (2006.01)

(52) U.S. Cl. ...................... 427/100; 427/379; 427/384; 29/25.35

(58) Field of Classification Search ................. 427/379, 427/384, 100; 29/25.35
See application file for complete search history.

(56) References Cited

U.S. PATENT DOCUMENTS

| 5,776,788 | A  | * | 7/1998  | Aoki et al.     | ................... 438/396 |
| 5,851,841 | A  | * | 12/1998 | Ushikubo et al. | ........... 438/240 |
| 6,013,970 | A  | * | 1/2000  | Nishiwaki et al. | ............ 310/330 |
| 6,103,072 | A  | * | 8/2000  | Nishiwaki et al. | ...... 204/192.18 |
| 6,543,107 | B1 | * | 4/2003  | Miyashita et al. | ........... 29/25.35 |
| 6,767,086 | B2 | * | 7/2004  | Murai            | ......................... 347/70 |
| 7,291,520 | B2 | * | 11/2007 | Murai            | ......................... 438/150 |

FOREIGN PATENT DOCUMENTS

| EP | 1 369 501 A2 | 12/2003 |
| JP | 9-223830 A | 8/1997 |
| JP | 2003-338607 A | 11/2003 |

* cited by examiner

*Primary Examiner*—Brian K Talbot
(74) *Attorney, Agent, or Firm*—Sughrue Mion, PLLC

(57) ABSTRACT

A method of manufacturing a dielectric film includes a coating step of coating sol made of an organic metal compound and forming a dielectric precursor film, a drying step of drying the dielectric precursor film, a degreasing step of degreasing the dielectric precursor film, and a baking step of baking the dielectric precursor film to form a dielectric film. The drying step includes a first drying step of drying the dielectric precursor film by heating the dielectric precursor film to a temperature lower than a boiling point of a solvent which is a main solvent of the sol and then holding the dielectric precursor film at the temperature for a predetermined period of time, and a second drying step of drying the dielectric precursor film further by reheating the dielectric precursor film and then holding the dielectric precursor film at the temperature for a predetermined period of time.

8 Claims, 17 Drawing Sheets

US 7,579,041 B2

METHOD OF MANUFACTURING DIELECTRIC LAYER AND METHOD OF MANUFACTURING LIQUID JET HEAD

BACKGROUND OF THE INVENTION

1. Field of the Invention

The present invention relates to a method of manufacturing a dielectric film made of a dielectric material including a piezoelectric material, and to a method of manufacturing a liquid jet head including a piezoelectric element having a piezoelectric film made of a piezoelectric material.

2. Description of the Related Art

A piezoelectric element used in a liquid jet head and the like is an element formed by sandwiching a piezoelectric film made of a piezoelectric material exhibiting an electromechanical conversion effect with two electrodes. The piezoelectric film is made of a crystallized piezoelectric ceramic, for example.

Meanwhile, a typical liquid jet head using such a piezoelectric element is an inkjet recording head, which includes a vibration plate constituting part of a pressure generating chamber that communicates with a nozzle orifice for ejecting ink droplets, for example. This inkjet recording head is configured to deform this vibration plate by use of the piezoelectric element to pressurize ink in the pressure generating chamber, and thereby to eject ink droplets from the nozzle orifice. There are two types of inkjet recording heads which have been put to practical use, namely, an inkjet recording head applying a piezoelectric actuator of a longitudinal vibration mode configured to expand and contract in an axial direction of the piezoelectric element, and an inkjet recording head applying a piezoelectric actuator of a flexural vibration mode. As the inkjet recording head applying the actuator of the flexural vibration mode, there is known an inkjet recording head in which a uniform piezoelectric film is formed over an entire surface of a vibration plate by use of a deposition technique and then piezoelectric elements are formed independently for respective pressure generating chambers by cutting this piezoelectric layer into shapes corresponding to the pressure generating chambers by use of a lithography method, for example.

Meanwhile, a so-called sol-gel method is known as a method of forming a piezoelectric layer constituting a piezoelectric element. Specifically, sol made of an organic metal compound is coated on a substrate formed with a lower electrode thereon, and the sol is dried and gelated (degreased) to form a precursor film for a piezoelectric body. This step is performed at least once, and then the precursor film is subjected to a heat treatment at a high temperature and is thereby crystallized. The piezoelectric layer (a piezoelectric thin film) having a predetermined thickness is manufactured by repeating the above-described steps for several times (see Patent Document 1, for example).

According to the manufacturing method described above, it is possible to form a piezoelectric layer having a thickness of 1 μm or above, for example, relatively favorably, and thereby to prevent occurrence of cracks and the like. However, it is difficult to control a crystalline state of the piezoelectric layer such as grain size or orientation. Accordingly, the conventional manufacturing method has a problem in that a piezoelectric layer of desired characteristics cannot be obtained. Such a problem is not only limited to piezoelectric films made of piezoelectric materials for use in piezoelectric elements for liquid jet head and the like, but similarly exists in dielectric films made of other dielectric materials.

(Patent Document 1)
Japanese Unexamined Patent Publication No. 9(1997)-223830 (pp. 4 to 6)

SUMMARY OF THE INVENTION

The present invention has been made in consideration of the foregoing problem of the related art. It is an object of the present invention to provide a method of manufacturing a dielectric film capable of controlling a crystalline state relatively easily and thereby obtaining stable characteristics constantly, and a method of manufacturing a liquid jet head capable of enhancing characteristics of a piezoelectric element.

To attain the object, a first aspect of the present invention provides a method of manufacturing a dielectric film including: a coating step of coating sol made of an organic metal compound and forming a dielectric precursor film; a drying step of drying the dielectric precursor film; a degreasing step of degreasing the dielectric precursor film; and a baking step of baking the dielectric precursor film to form a dielectric film. Here, the drying step includes a first drying step of drying the dielectric precursor film by heating the dielectric precursor film to a temperature lower than a boiling point of a solvent which is a main solvent of the sol and then holding the dielectric precursor film at the temperature for a predetermined period of time, and a second drying step of drying the dielectric precursor film further by reheating the dielectric precursor film and then holding the dielectric precursor film at the temperature for a predetermined period of time.

According to the first aspect, it is possible to grow crystals of a dielectric film favorably, and to form the dielectric film having a desired crystalline state.

A second aspect of the present invention provides the method of manufacturing a dielectric film according to the first aspect, in which the method includes the first drying step, the second drying step, the degreasing step, and the baking step independently.

According to the second aspect, it is possible to grow crystals of a dielectric film favorably, and to form the dielectric film having a desired crystalline state.

A third aspect of the present invention provides the method of manufacturing a dielectric film according to the first aspect, in which heating is continuously performed without lowering the temperature in at least two consecutive steps out of the first drying step, the second drying step, the degreasing step, and the baking step.

According to the third aspect, by performing the continuous heating without lowering the temperature in consecutive steps, it is possible to shorten time for heat treatment and to reduce manufacturing costs without wasting energy for the heating.

A fourth aspect of the present invention provides the method of manufacturing a dielectric film according to the third aspect, in which the heating is continuously performed without lowering the temperature in the consecutive steps of the first and second drying steps, the degreasing step, and the baking step.

According to the fourth aspect, by performing the continuous heating without lowering the temperature in the consecutive steps, it is possible to further shorten the time for heat treatment and to reduce manufacturing costs without wasting the energy for the heating.

A fifth aspect of the present invention provides the method of manufacturing a dielectric film according to the third or fourth aspect, in which at least two consecutive steps out of the first drying step, the second drying step, the degreasing step, and the baking step are performed by use of a rapid thermal processing (RTP) device.

According to the fifth aspect, it is possible to perform the continuous heating in consecutive steps without lowering the temperature by use of the RTP device, to enhance heat uniformity in terms of an in-plane direction of the dielectric precursor film, and thereby to form a dielectric film having uniform characteristics in terms of the in-plane direction.

A sixth aspect of the present invention provides the method of manufacturing a dielectric film according to any of the first to fifth aspects, in which crystals are subjected to preferred orientation along a (100) plane of a rhombohedral system by adjusting a temperature to be attained in the second drying step.

According to the sixth aspect, it is possible to form a dielectric film which is excellent in mechanical characteristics by controlling the orientation of the crystals.

A seventh aspect of the present invention provides the method of manufacturing a dielectric film according to any of the first to sixth aspects, in which grain sizes are controlled by adjusting a rate of temperature rise in the second drying step.

According to the seventh aspect, it is possible to form a dielectric film having desired grain sizes, and thereby to enhance the mechanical characteristics of the dielectric film.

An eighth aspect of the present invention provides the method of manufacturing a dielectric film according to any of the first to seventh aspects, in which the dielectric precursor film is heated to a temperature higher by a range from 100 degrees C. to 300 degrees C. than the boiling point of the solvent in the degreasing step.

According to the eighth aspect, it is possible to degrease the dielectric precursor film, and thereby to enhance the characteristics of a dielectric film.

A ninth aspect of the present invention provides the method of manufacturing a dielectric film according to any of the first to eighth aspects, in which the dielectric precursor film is heated to a temperature higher by at least 400 degrees C. than the boiling point of the solvent in the baking step.

According to the ninth aspect, it is possible to bake the dielectric precursor film favorably, and thereby to enhance the characteristics of a dielectric film.

A tenth aspect of the present invention provides a method of manufacturing a liquid jet head including the step of forming a piezoelectric element, in a region opposed to each pressure generating chamber communicating with each nozzle orifice for ejecting a droplet, through a vibration plate constituting one side of the pressure generating chamber. Here, the step of forming a piezoelectric element includes the steps of forming a lower electrode film on the vibration plate, forming a piezoelectric layer on the lower electrode film, and forming an upper electrode film on the piezoelectric layer. Moreover, in the step of forming a piezoelectric layer, the piezoelectric layer composed of a plurality of piezoelectric films is laminated by repeatedly performing a piezoelectric layer forming process of: a step of coating sol made of an organic metal compound and forming a piezoelectric precursor film; a first drying step of drying the piezoelectric precursor film by heating the piezoelectric precursor film to a temperature lower than a boiling point of a solvent which is a main solvent of the sol and then holding the piezoelectric precursor film at the temperature for a predetermined period of time; a second drying step of further drying the piezoelectric precursor film by heating the piezoelectric precursor film to a temperature equal to or higher than the boiling point of the solvent and then holding the piezoelectric precursor film at the temperature for a predetermined period of time; a degreasing step of degreasing the piezoelectric precursor film by heating the piezoelectric precursor film to a temperature higher than the boiling point of the solvent; and a baking step of baking the piezoelectric precursor film to crystallize the piezoelectric precursor film into the piezoelectric film.

According to the tenth aspect, it is possible to enhance mechanical and electrical characteristics of a piezoelectric layer, and thereby to enhance a displacement characteristic of the piezoelectric element.

An eleventh aspect of the present invention provides the method of manufacturing a liquid jet head according to the tenth aspect, in which the method includes the first drying step, the second drying step, the degreasing step, and the baking step independently.

According to the eleventh aspect, it is possible to grow crystals of a piezoelectric film favorably, and to form the piezoelectric film having a desired crystalline state.

A twelfth aspect of the present invention provides the method of manufacturing a liquid jet head according to the tenth aspect, in which heating is continuously performed without lowering the temperature in at least two consecutive steps out of the first drying step, the second drying step, the degreasing step, and the baking step.

According to the twelfth aspect, by performing the continuous heating without lowering the temperature in consecutive steps, it is possible to shorten time for heat treatment and to reduce manufacturing costs without wasting energy for the heating.

DETAILED DESCRIPTION OF THE PREFERRED EMBODIMENTS

Embodiment 1

Figure 1:
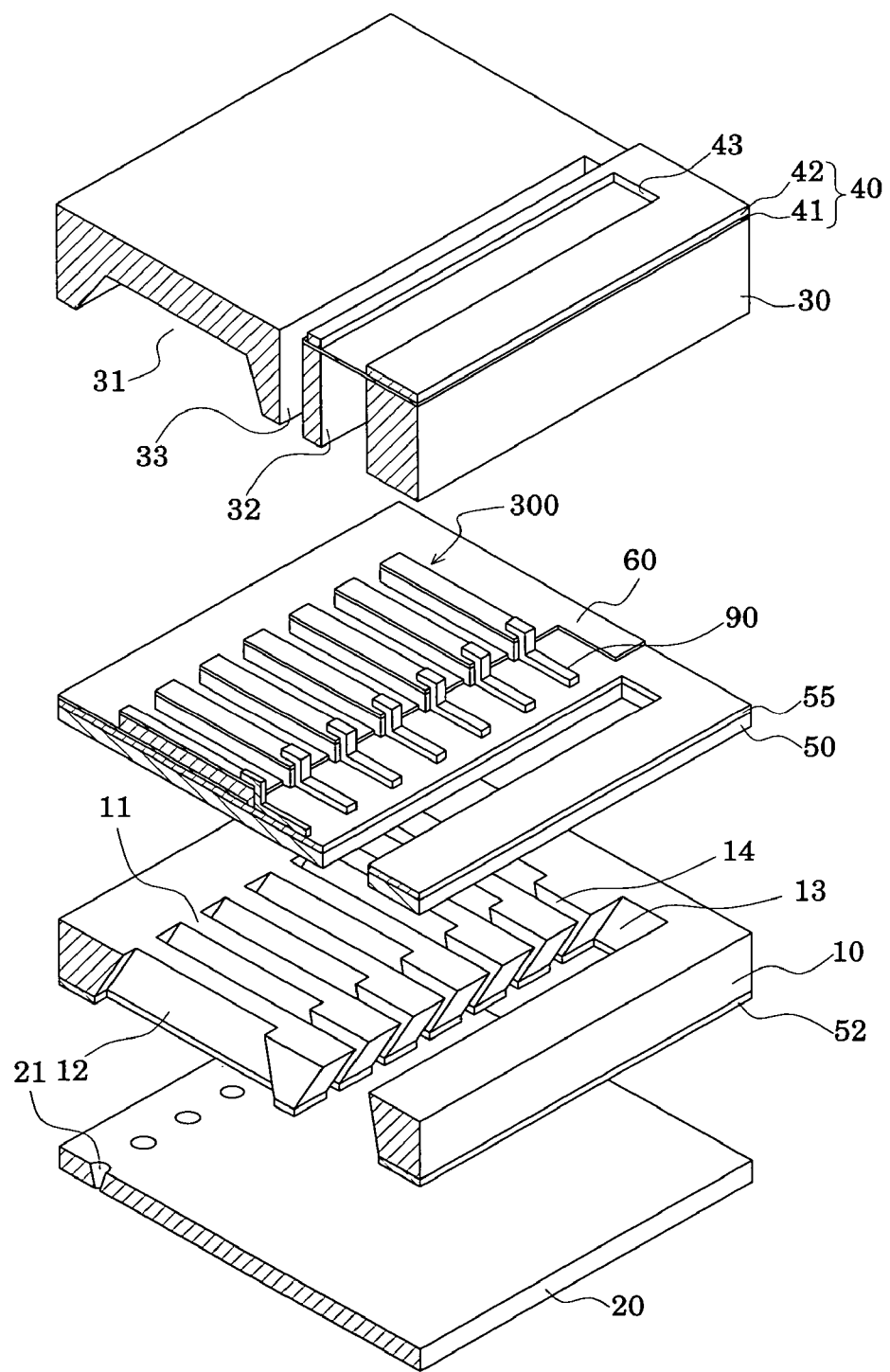
FIG. 1 is an exploded perspective view of a recording head according to Embodiment 1.
Figure 2A:
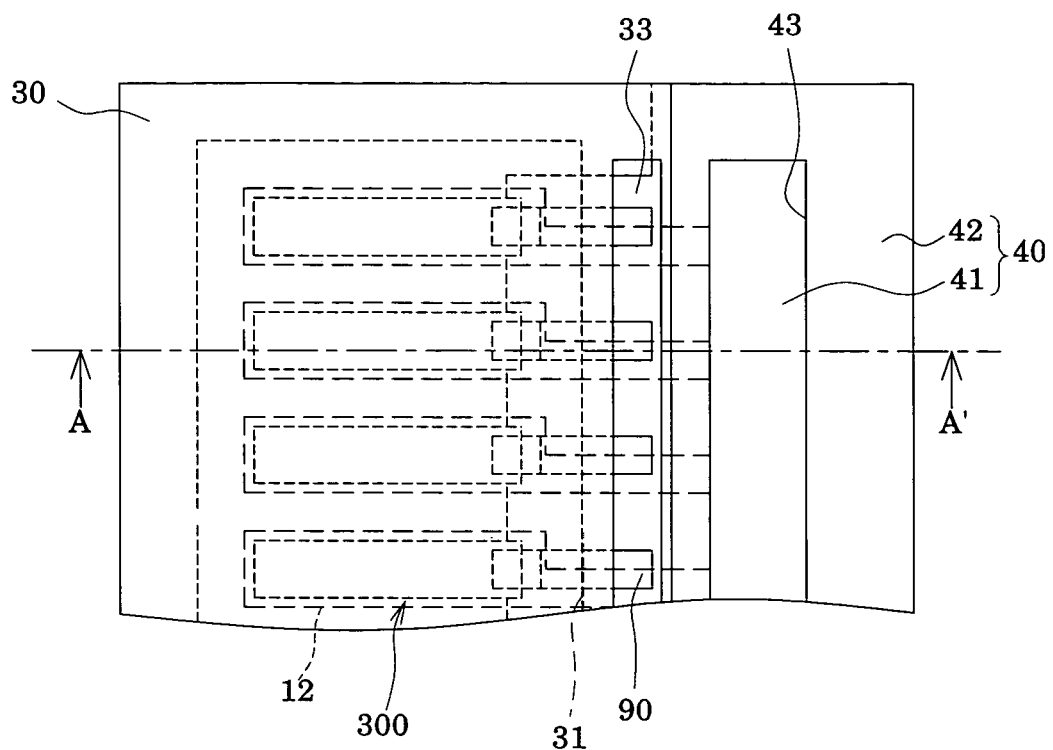
FIG. 2A is a plan view and FIG. 2B is a cross-sectional view of the recording head according to Embodiment 1.
Figure 2B:
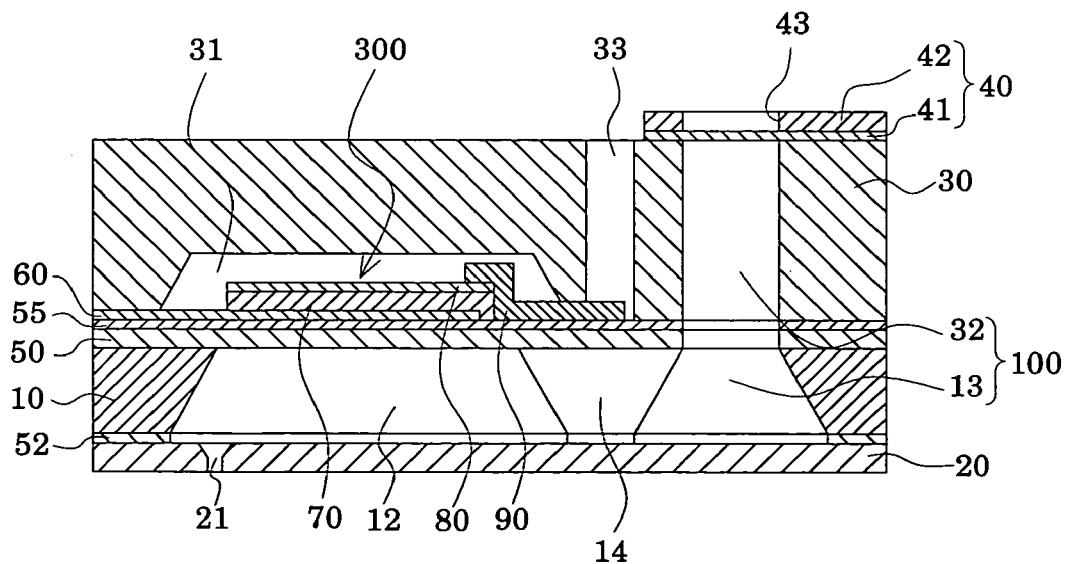

FIG. 1 is an exploded perspective view showing an inkjet recording head according to Embodiment 1 of the present invention. FIGS. 2A and 2B are a plan view and a cross-sectional view of the inkjet recording head of FIG. 1. As shown in the drawings, a passage-forming substrate 10 is made of a single crystal silicon substrate having a plane orientation (110) in this embodiment. An elastic film 50 made of silicon dioxide previously formed by thermal oxidation and having a thickness in a range from 0.5 to 2 μm is formed on one surface of the passage-forming substrate 10. A plurality of pressure generating chambers 12 are arranged in a width direction on the passage-forming substrate 10. Meanwhile, a communicating portion 13 is formed in a region outside in the longitudinal direction of the pressure generating chambers 12 on the passage-forming substrate 10, and the communicating portion 13 and the respective pressure generating chambers 12 communicate with one another through ink supply paths 14 provided for the respective pressure generating chambers 12. Here, the communicating portion 13 communicates with a reservoir portion of a protective plate to be described later, and thereby constitutes part of a reservoir which is a common ink chamber to the respective pressure generating chambers 12. Each of the ink supply paths 14 is formed in a narrower width than the width of each of the pressure generating chambers 12, and thereby maintains constant passage resistance for ink flowing from the communicating portion 13 into the pressure generating chamber 12.

Meanwhile, a nozzle plate 20 having nozzle orifices 21, which are drilled thereon for communicating with the vicinity of end portions of the respective pressure generating chambers 12 at the opposite side to the ink supply paths 14, is fixed to an opening surface side of the passage-forming substrate 10 through an adhesive agent, a thermowelding film or the like. Here, the nozzle plate 20 is made of a glass ceramic, a single crystal silicon substrate, stainless steel or the like having a thickness in a range from 0.01 to 1 mm and a coefficient of linear expansion in a range from 2.5 to 4.5 [×10$^{-6}$ /degree C.] at a temperature equal to or below 300 degrees C., for example.

Meanwhile, as described previously, an elastic film 50 made of silicon dioxide ($SiO_2$) and having a thickness of about 1.0 μm, for example, is formed on a side opposite the opening surface of the passage-forming substrate 10. An insulation film 55 made of zirconium oxide ($ZrO_2$) having a thickness of about 0.4 μm, for example, is formed on this elastic film 50. Moreover, a lower electrode film 60 having a thickness of about 0.2 μm, for example, a piezoelectric layer 70 having a thickness of about 1.0 μm, for example, and an upper electrode film 80 having a thickness of about 0.05 μm, for example, are formed and laminated in a process to be described later, and these constituents collectively constitute a piezoelectric element 300. Here, the piezoelectric element 300 means the portion including the lower electrode film 60, the piezoelectric layer 70, and the upper electrode film 80. In general, one of the electrodes in the piezoelectric element is defined as a common electrode, and the other electrode and the piezoelectric layer 70 are patterned in conformity to the respective pressure generating chambers 12. Moreover, the portion including the patterned electrode and piezoelectric layer 70 and exhibiting piezoelectric strain by application of a voltage to the both electrodes will be herein referred to as a piezoelectric active portion. In this embodiment, the lower electrode film 60 is used as the common electrode of the piezoelectric element 300, and the upper electrode film 80 as an individual electrode of the piezoelectric element 300. However, it is possible to invert the functions of these electrode films due to convenience for designing driving circuits or wiring. In any case, the piezoelectric active portion is formed on each of the pressure generating chambers. Meanwhile, the piezoelectric element 300 and a vibration plate undergoing displacement by a drive of the piezoelectric element 300 will be herein collectively referred to as a piezoelectric actuator. Moreover, lead electrodes 90 made of gold (Au) or the like, for example, are connected to the upper electrode films 80 of the respective piezoelectric elements 300 as described above, and voltages are selectively applied to the respective piezoelectric elements 300 through the lead electrodes 90.

Here, the material for the piezoelectric layer 70 constituting the piezoelectric element 300 as described above may be, for example, a ferroelectric and piezoelectric material such as lead zirconate titanate (PZT), or a relaxor ferroelectric material formed by adding metal such as niobium, nickel, magnesium, bismuth or yttrium to the ferroelectric and piezoelectric material. The composition of the material may be appropriately selected in consideration of intended characteristics, application, and the like of the piezoelectric element 300. For example, the composition may include $PbTiO_3$ (PT), $PbZrO_3$ (PZ), $Pb(Zr_xTi_{1-x})O_3$ (PZT), $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), $Pb(Ni_{1/3}Nb_{2/3})O_3$—$PbTiO_3$ (PNN-PT), $Pb(In_{1/2}Nb_{1/2})O_3$—$PbTiO_3$ (PIN-PT), $Pb(Sc_{1/2}Ta_{1/2})O_3$—$PbTiO_3$ (PST-PT), $Pb(Sc_{1/2}Nb_{1/2})O_3$—$PbTiO_3$ (PSN-PT), $BiScO_3$—$PbTiO_3$ (BS-PT), $BiYbO_3$—$PbTiO_3$ (BY-PT), and the like.

Meanwhile, a protective plate 30 having a piezoelectric element holding portion 31 capable of securing a sufficient space in a region facing the piezoelectric elements 300 so as not to inhibit actions thereof is joined onto a surface of the passage-forming substrate 10 on the piezoelectric element 300 side. The piezoelectric elements 300 are formed inside this piezoelectric element holding portion 31, and thus are protected in a state substantially not susceptible to influences from external environments. Moreover, a reservoir portion 32 is provided for the protective plate 30 in a region corresponding to the communicating portion 13 of the passage-forming substrate 10. In this embodiment, the reservoir portion 32 is provided along the direction of arrangement of the pressure generating chambers 12 while penetrating the protective plate 30 in the thickness direction, and is communicated with the communicating portion 13 of the passage-forming substrate 10 as described above. In this way, the communicating portion 13 and the reservoir portion 32 collectively constitute a reservoir 100 which is the common ink chamber to the respective pressure generating chambers 12.

Meanwhile, a through-hole 33 is provided in a region between the piezoelectric element holding portion 31 and reservoir portion 32 of the protective plate 30 so as to penetrate the protective plate 30 in its thickness direction. Parts of the lower electrode film 60 and heads of the lead electrodes 90 are exposed inside this through-hole 33. Although it is not illustrated in the drawing, ends of connection wiring extending from a driving IC are connected to the lower electrode film 60 and to the lead electrodes 90.

Here, the material for the protective plate 30 may be glass, a ceramic material, metal, resin, or the like. However, it is preferable to form the protective plate 30 by use of a material having substantially the same coefficient of thermal expansion as that of the passage-forming substrate 10. In this embodiment, the protective plate 30 is formed by use of a single crystal silicon substrate which is the same material as the passage-forming substrate 10.

Meanwhile, a compliance plate 40 including a sealing film 41 and a fixing plate 42 is joined onto the protective plate 30. The sealing film 41 is made of a material having low stiffness and sufficient flexibility (a polyphenylene sulfide (PPS) film having a thickness of 6 μm, for example). One side of the reservoir portion 32 is sealed by this sealing film 41. Meanwhile, the fixing plate 42 is made of a hard material such as metal (stainless steel (SUS) having a thickness of 30 μm, for example). A region of this fixing plate 42 opposite to the reservoir 100 is completely removed in its thickness direction and is thereby formed into an opening portion 43. Accordingly, one side of the reservoir 100 is sealed only by the flexible sealing film 41.

In the inkjet recording head of this embodiment described above, ink is taken in from unillustrated external ink supplying means, and all of the interior from the reservoir 100 to the nozzle orifices 21 is filled with the ink. Then, voltages are applied between the lower electrode film 60 and the respective upper electrode films 80 corresponding to the pressure generating chambers 12, whereby the elastic film 50, the insulation film 55, the lower electrode film 60, and the piezoelectric layers 70 are subjected to flexural deformation. Accordingly, pressure in each of the pressure generating chambers 12 is increased and ink droplets are ejected from the nozzle orifice 21.

Figure 3A:
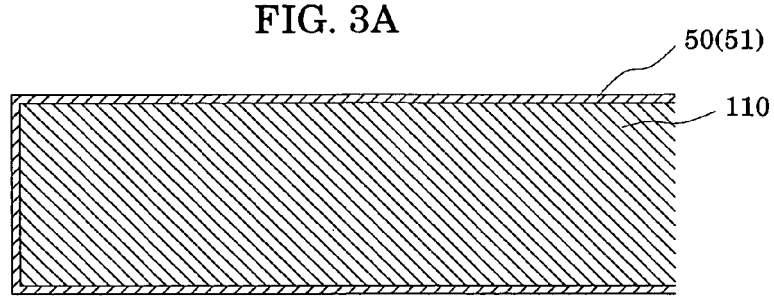
FIGS. 3A to 3D are cross-sectional views showing a manufacturing process of the recording head according to Embodiment 1.

Now, a method of manufacturing the inkjet recording head as described above will be described with reference to FIG. 3A to FIG. 6C. FIG. 3A to FIG. 6C are cross-sectional views in the longitudinal direction of the pressure generating chamber 12. First, as shown in FIG. 3A, a passage-forming substrate wafer 110 which is a silicon wafer is subjected to thermal oxidation in a diffusion furnace set to a temperature of about 1100 degrees C., and a silicon dioxide film 51 constituting the elastic film 50 is formed on a surface thereof. In this embodiment, a relatively thick and stiff silicon wafer having a plate thickness of about 625 μm is used as the passage-forming substrate 10.

Figure 3B:
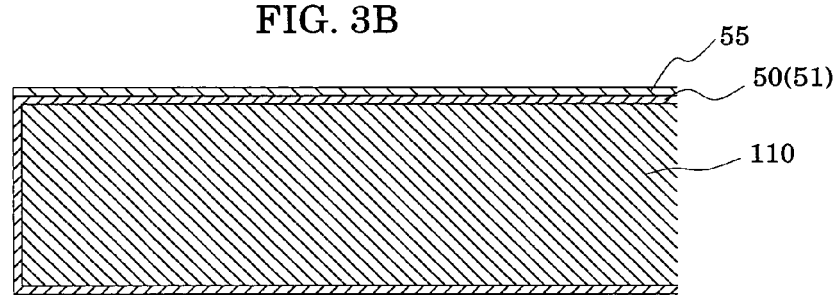

Subsequently, as shown in FIG. 3B, the insulation film 55 made of zirconium oxide is formed on the elastic film 50 (the silicon dioxide film 51). To be more precise, a zirconium layer is first formed on the elastic film 50 by use of a DC sputtering method, for example, then, this zirconium layer is subjected to thermal oxidation to form the insulation film 55 made of zirconium oxide.

Figure 3C:
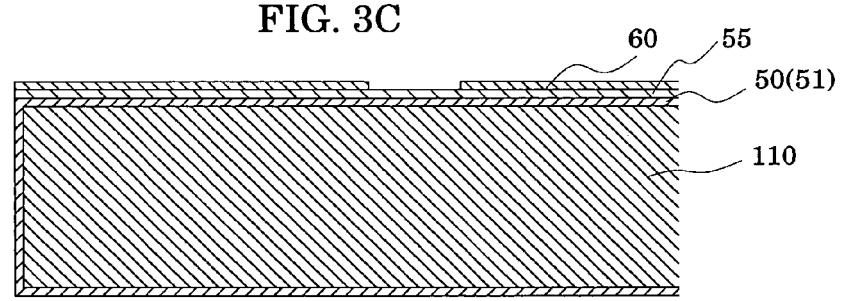

Next, as shown in FIG. 3C, the lower electrode film 60 is formed by laminating platinum and iridium on the insulation film 55, for example. Thereafter, this lower electrode film 60 is patterned into a predetermined shape.

Figure 3D:
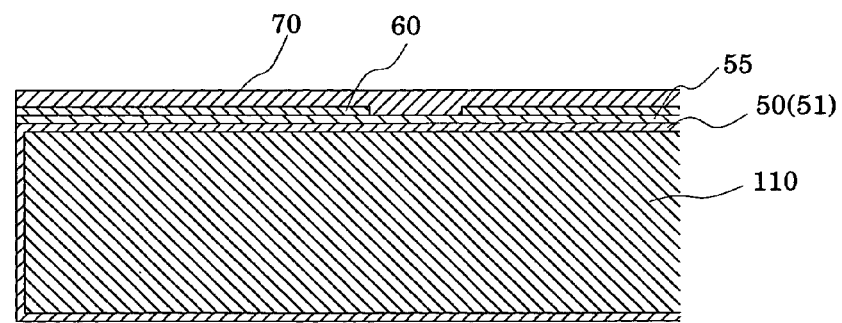

Next, the piezoelectric layer 70 made of lead zirconate titanate (PZT), for example, is formed as shown in FIG. 3D. Here, in this embodiment, the piezoelectric layer 70 is formed by use of a so-called sol-gel method, in which so-called sol formed by dissolving and dispersing a metal-organic material into a solvent is coated and dried for gelation, and then by baking the material at a high temperature to obtain the piezoelectric layer 70 made of metal oxide. Here, the material for the piezoelectric layer 70 is not limited only to lead zirconate titanate. It is also possible to use other piezoelectric materials in relaxor ferroelectric materials (such as PMN-PT, PZN-PT or PNN-PT), for example. Moreover, the method of manufacturing the piezoelectric layer 70 is not limited only to the sol-gel method. It is also possible to use a metal-organic decomposition (MOD) method, for example.

Figure 4A:
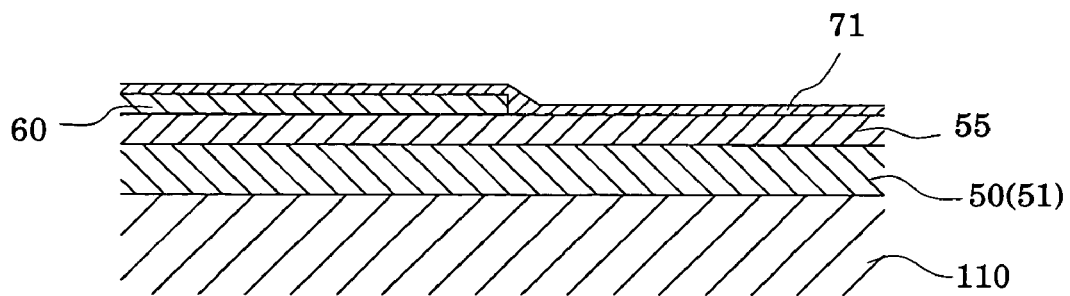
FIGS. 4A to 4C are cross-sectional views showing the manufacturing process of the recording head according to Embodiment 1.

In the concrete procedures for forming the piezoelectric layer 70, firstly, a piezoelectric precursor film 71 which is a PZT precursor film is formed on the lower electrode film 60 as shown in FIG. 4A. Specifically, the sol containing a metal-organic compound (a solution) is coated on the passage-forming substrate 10 formed with the lower electrode film 60 (a coating step). Subsequently, the piezoelectric precursor film 71 is heated from a room temperature to a temperature lower than a boiling point of the solvent which is a main solvent of the sol for drying for a predetermined period of time. In this way, the piezoelectric precursor film 71 is dried by evaporating the solvent of the sol (a first drying step).

Here, the main solvent of the sol is not particularly limited. However, it is preferable to use an ethanol solvent, for example. In this embodiment, 2-n-butoxyethanol having a boiling point of 176 degrees C. is used. Accordingly, in this embodiment, in the first drying step 200 shown in FIG. 7, the piezoelectric precursor film 71 is dried by heating the coated sol to a temperature of less or equal to temperature equal to 176 degrees C. which is the boiling point of the solvent (indicated with a dotted line in the drawing), or to about 170 degrees C., for example, and then holding the piezoelectric precursor film 71 at this temperature for about 8 to 10 minutes.

Figure 7:
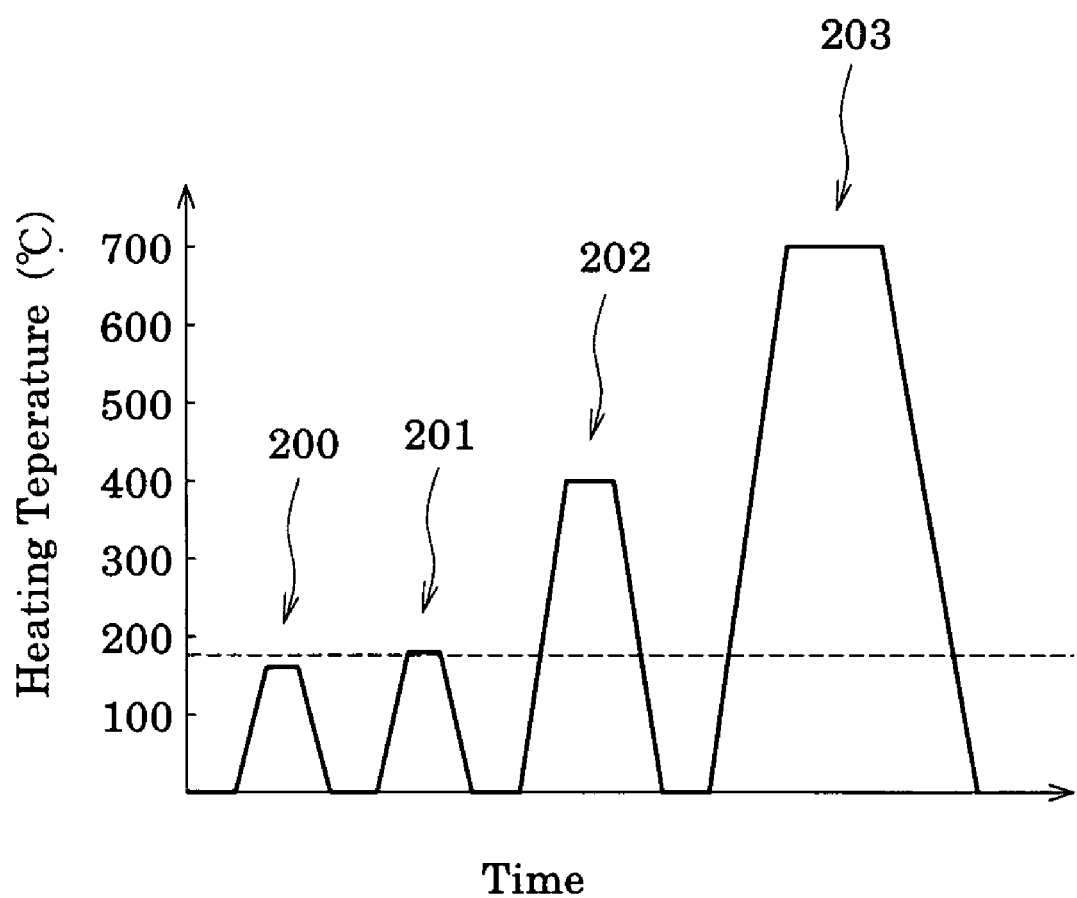
FIG. 7 is a graph showing a temperature profile according to Embodiment 1.

Subsequently, the main solvent of the sol is further evaporated by reheating the piezoelectric precursor film 71, or by heating the piezoelectric precursor film 71 to a temperature higher than the boiling point of the solvent which is the main solvent of the sol and then holding the piezoelectric precursor film 71 at this temperature for a predetermined period of time in this embodiment, for example, thereby drying the piezoelectric precursor film 71 (a second drying step). The temperature to be attained in the second drying step 201 is preferably set in a range from 178 degrees C. to 180 degrees C. which is higher than the boiling point of the solvent. Meanwhile, the drying time is preferably set in a range from 8 to 30 minutes. For example, in this embodiment, in the second drying step 201 as shown in FIG. 7, the temperature is raised to about 178 degrees C. which is higher than the boiling point of the solvent, and the piezoelectric precursor film 71 was held at this temperature for 15 to 30 minutes. When the temperature to be attained is set to 180 degrees C., for example, the temperature may be held for 8 to 10 minutes.

Moreover, it is preferable to set a rate of temperature rise in a range from 0.5 to 1.5 (degrees C./sec) in this second drying step. Here, the "rate of temperature rise" will be defined as a rate of temperature change with time consumed from a temperature higher than a starting temperature by 20% of a temperature difference which is a difference between a temperature when starting the heating (room temperature) and the attained temperature, until reaching a temperature higher by 80% of the temperature difference than the starting temperature. For example, the rate of temperature rise when heating from a room temperature of 25 degrees C. up to 100 degrees C. in 50 seconds will be calculated as $(100-25) \times (0.8-0.2)/50 = 0.9$ degrees C./sec).

Moreover, a heating device used in the above-described drying steps may be a clean oven (a diffusion furnace), a baking device, and the like. However, it is preferable to use the baking device in particular. Since the clean oven controls the temperature by blowing hot air, the characteristic of the piezoelectric precursor film tends to vary in terms of the in-plane direction of the passage-forming substrate wafer.

After drying the piezoelectric precursor film 71 in the first and second drying steps as described above, the piezoelectric precursor film 71 is further degreased for a predetermined period of time in an air atmosphere at a certain temperature (a degreasing step). Here, the degreasing means to remove organic components in the sol film in the form of $NO_2$, $CO_2$, $H_2O$ or the like, for example.

A heating method in the degreasing step is not particularly limited. However, in this embodiment, the passage-forming substrate wafer is placed on a hot plate through a jig which is an aluminum plate having a predetermined thickness and an outside diameter slightly larger than the passage-forming substrate, and then the piezoelectric precursor film 71 is heated to the predetermined temperature. The temperature to be attained in the degreasing step is preferably higher by a temperature selected from a range from 100 degrees C. to 300 degrees C. than the boiling point of the solvent which is the main solvent of the sol. For example, since the boiling point of the solvent is 176 degrees C. in this embodiment, the degreasing temperature is set preferably in a range from 276 degrees C. to 476 degrees C., or more preferably in a range from 300 degrees C. to 400 degrees C. Crystallization is initiated if the temperature is too high, and it is not possible to achieve sufficient degreasing if the temperature is too low. Moreover, it is preferable to perform the degreasing step at least for ten minutes. In this embodiment, in the degreasing step 202, the dried piezoelectric precursor film 71 is degreased by raising the temperature to about 300 degrees C. to 400 degrees C. and holding the piezoelectric precursor film 71 at the temperature for about 15 to 30 minutes as shown in FIG. 7. Here, in this embodiment, it is most preferable to set the temperature to be attained to about 320 degrees C. in the degreasing step.

Meanwhile, the rate of temperature rise in the degreasing step is the key to enhancing crystallinity of the piezoelectric layer. To be more precise, it is preferable to set the rate of temperature rise in the range from 0.5 to 1.5 (degrees C./sec) in the degreasing step. In this way, it is possible to enhance (100) orientation strength of the piezoelectric layer and to suppress unevenness in the orientation strength in terms of the in-plane direction of the passage-forming substrate wafer.

Here, the "rate of temperature rise" will be defined as a rate of temperature change with time consumed from a temperature higher than a starting temperature by 20% of a temperature difference which is a difference between a temperature when starting the heating (room temperature) and the attained temperature, until reaching a temperature higher by 80% of the temperature difference than the starting temperature, as similar to the drying steps.

Figure 8:
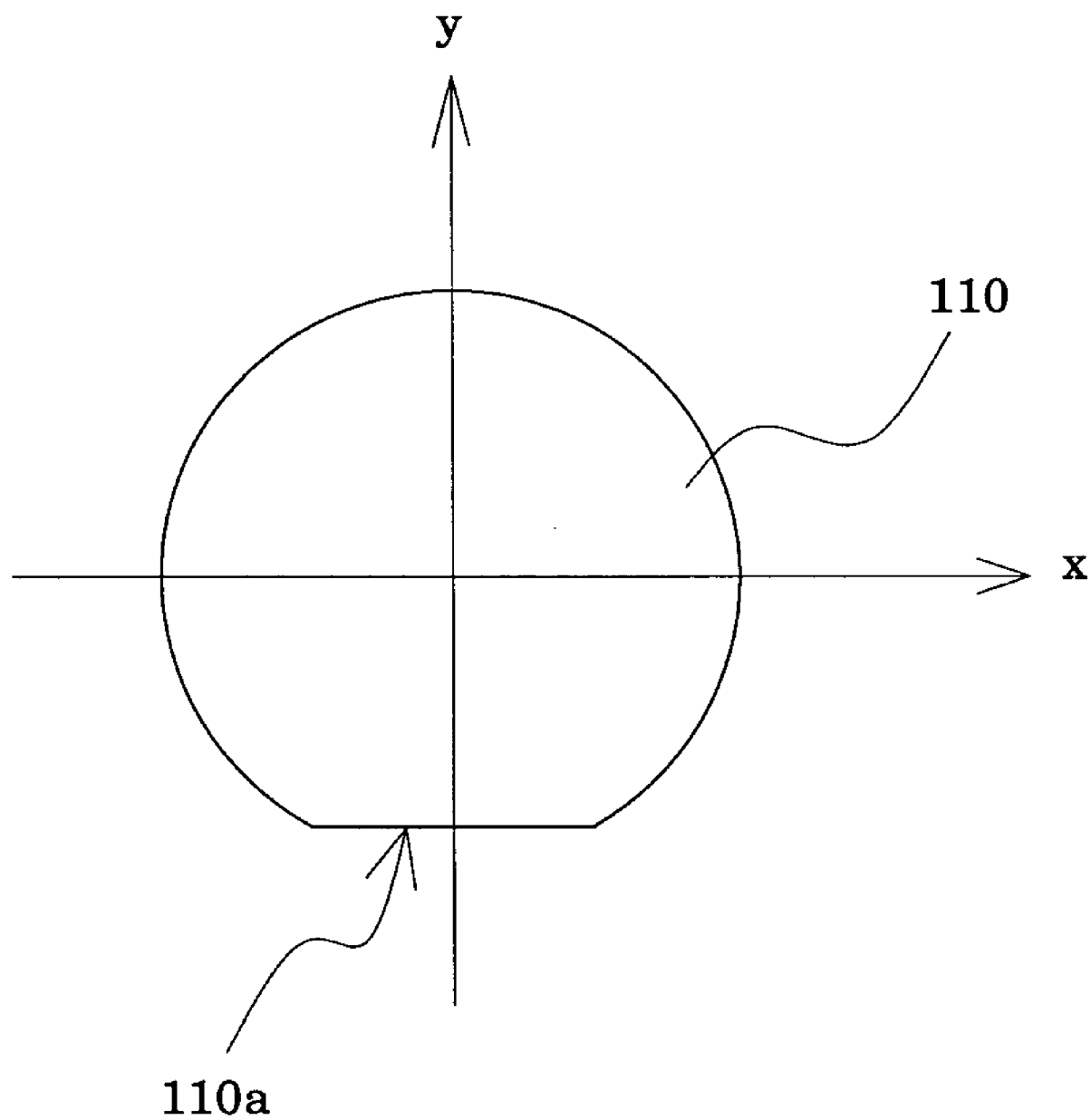
FIG. 8 is a view showing a method of measuring orientation strength.

Here, the piezoelectric precursor film 71 is degreased while setting the rate of temperature rise to about 1.0 (degree C./sec), about 1.6 (degrees C./sec), and about 4.5 (degrees C./sec) and unevenness in the (100) orientation strength of the piezoelectric layer in terms of the in-plane direction of the passage-forming substrate wafer 110 is examined in each case. To be more precise, the piezoelectric precursor film 71 is degreased at each of the rates of temperature rise described above by heating the passage-forming substrate wafer 110 by use of the jig having the predetermined thickness and in conditions of 320 degrees C. of temperature to be attained and 15 minutes of heating time. Thereafter, the piezoelectric layer is formed by executing a baking step to be described later. Then, as shown in FIG. 8, the (100) orientation strength is measured in multiple positions on an x axis in a horizontal direction with respect to an orientation flat plane 110a and on a y axis in a perpendicular direction with respect thereto based on the center of the passage-forming substrate wafer 110 as a reference point.

Figure 9A:
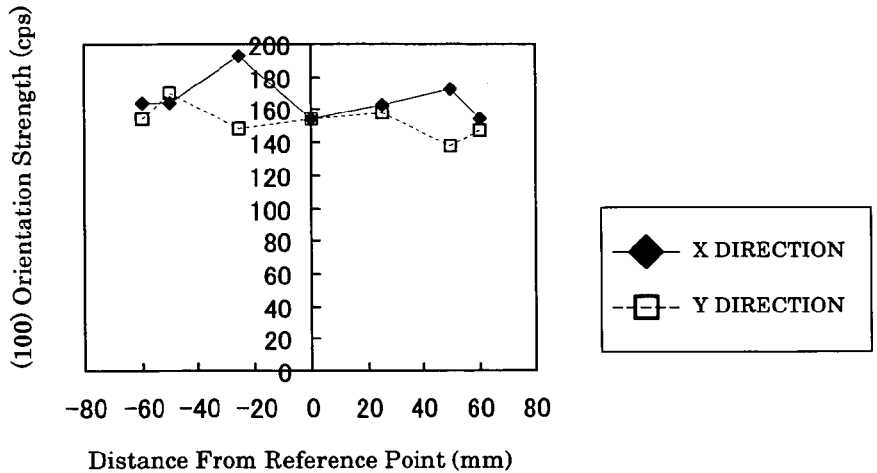
FIGS. 9A to 9C are graphs showing unevenness in the orientation strength in terms of an in-plane direction of a wafer.
Figure 9B:
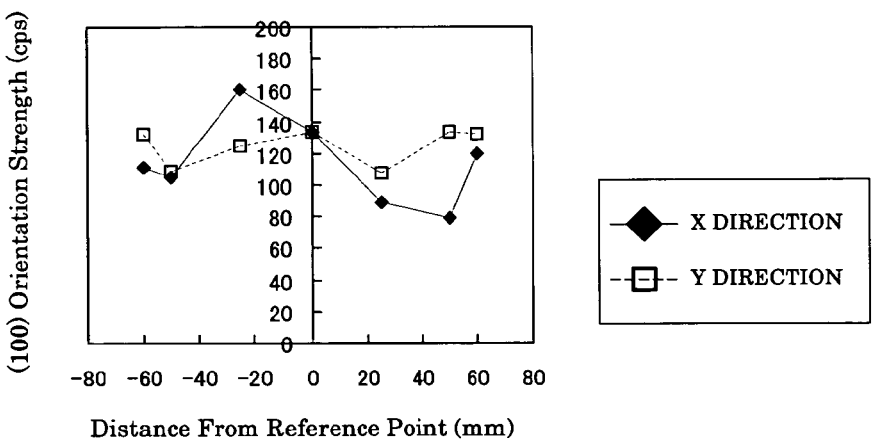
Figure 9C:
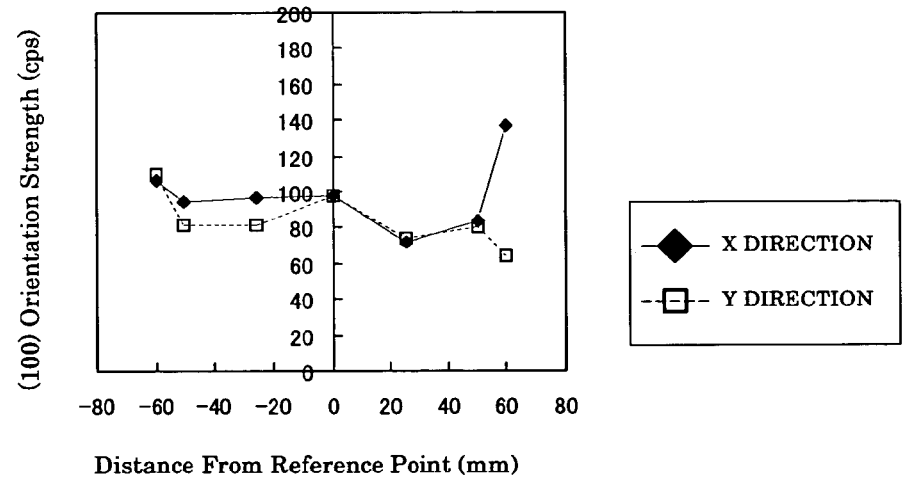

FIGS. 9A to 9C are graphs showing the (100) orientation strength of the piezoelectric layers. As shown in FIG. 9A, when the rate of temperature rise is set to about 1.0 (degree C./sec), the (100) orientation strength of the piezoelectric layer is greater than 140 (cps) in every position of measurement. Accordingly, an excellent result is obtained. Meanwhile, as shown in FIG. 9B, when the rate of temperature rise is set to about 1.6 (degrees C./sec), the (100) orientation strength of the piezoelectric layer is relatively high at about 160 (cps) in a certain position. However, unevenness in the orientation strength is more significant in terms of the in-plane direction of the wafer. It is to be noted, however, that an excellent result similar to the case of setting the rate of temperature rise to about 1.0 (degree C./sec) is also obtained only occasionally when setting the rate of temperature rise to about 1.6 (degrees C./sec).

On the contrary, as shown in FIG. 9C, when the rate of temperature rise is set to about 4.5 (degrees C./sec), the (100) orientation strength of the piezoelectric layer is considerably low at 100 (cps) or thereabout in any position of measurement. Moreover, unevenness in the orientation strength in the same wafer is relatively large at about 70 (cps) at the maximum. Accordingly, it is not possible to obtain a favorably result.

From these results, it is apparent that an excessive rate of temperature rise in the degreasing step is not favorable because of degradation of the crystallinity of the piezoelectric layer, and that the piezoelectric layer having the favorable crystallinity can be formed by relatively slowing down the rate of temperature rise in the degreasing step to about 1.5 (degrees C./sec) or below. In the meantime, it is not preferable to set the rate of temperature rise too low because such an operation leads to lower productivity. From these findings, it is preferable to set the rate of temperature rise in the range from about 0.5 to 1.5 (degrees C./sec) in the degreasing step.

Figure 4B:
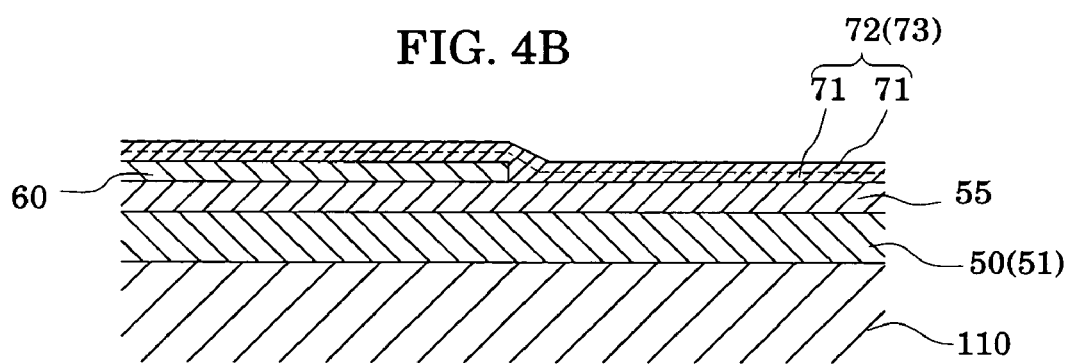

Now, a cycle of the coating step, the first drying step, the second drying step, and the degreasing step is repeated for a predetermined number of times, such as twice in this embodiment, whereby piezoelectric precursor film 72 having a predetermined thickness is formed as shown in FIG. 4B. In this embodiment, the piezoelectric precursor film 72 having the predetermined thickness is formed by repeating the cycle of the coating step, the first drying step, the second drying step, and the degreasing step is repeated twice. However, it is needless to say that the number of repetition of the cycle is not limited to twice. It is possible to execute the cycle only once or more than twice.

Thereafter, this piezoelectric precursor film 72 is subjected to a heat treatment for crystallization, and is thereby formed into a piezoelectric layer 73 (a baking step) Baking conditions may vary depending on the material. For example, in this embodiment, the piezoelectric precursor film 72 is baked by heating at a temperature of 680 degrees C. or above for 5 to 30 minutes in the baking step 203 to form the piezoelectric film 73 as shown in FIG. 7. In addition to a diffusion furnace, it is also possible to use a rapid thermal annealing (RTA) device as a heating device, for example.

Figure 4C:
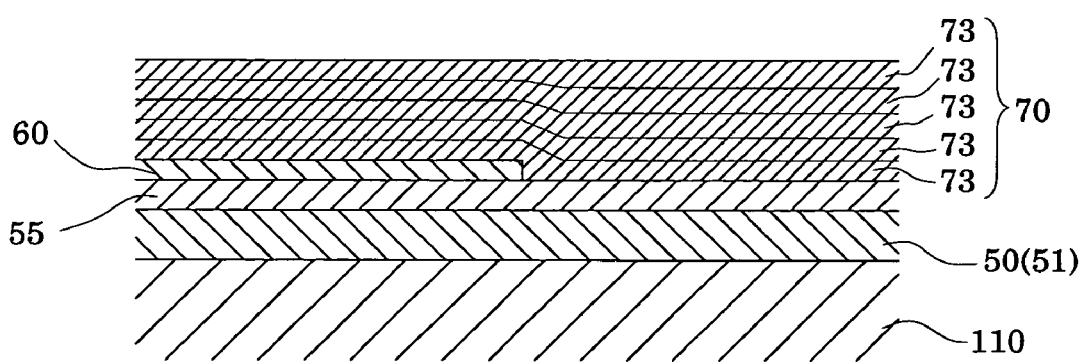

Now, by repeating the above-described cycle of the coating step, the first and second drying steps, the degreasing step, and the baking step for a number of times, the piezoelectric film 70 having the predetermined thickness and including a plurality of piezoelectric films 73, such as five layers in this embodiment, is formed as shown in FIG. 4C. For example, if a film thickness is about 0.1 µm at each time of coating the sol, then the entire film thickness of the piezoelectric layer 70 will be about 1 µm.

In this way, by independently performing the steps for heating the piezoelectric precursor film 71, namely, the first drying step 200, the second drying step 201, the degreasing step 202, and the baking step 203 (see FIG. 7), it is possible to form the piezoelectric layer 70 having excellent performances. In addition, by adjusting the temperature to be attained in the second drying step 201, it is possible to control the crystal orientation of the piezoelectric layer. For example, since the crystal system of the piezoelectric layer 70 according to this embodiment has a rhombohedral system, it is preferable that the crystals thereof are oriented to the (100) plane. Moreover, in this embodiment, it is possible to orient the crystals to the (100) plane by raising the temperature higher than the boiling point of the solvent which is the main solvent of the sol in the second drying step 201. Here, if the temperature to be attained in the second drying step 201 is set to a temperature lower than the boiling point of the solvent which is the main solvent of the sol, the crystals of the piezoelectric layer 70 are oriented to the (111) plane.

Figure 10:
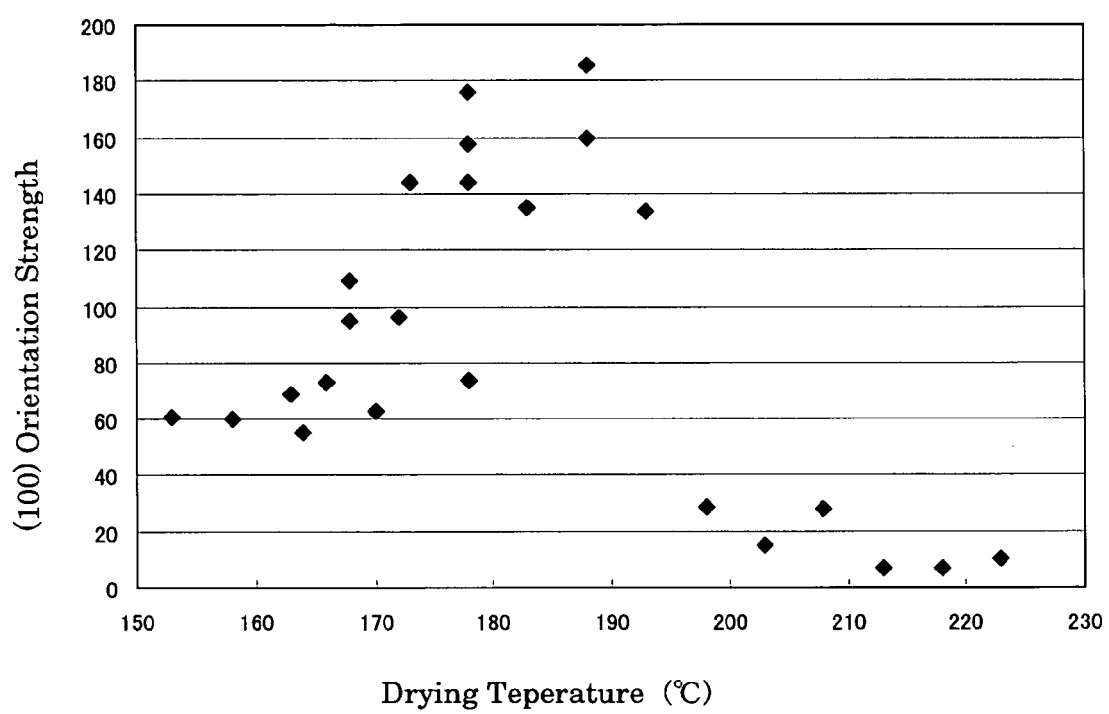
FIG. 10 is a graph showing a relation between a drying temperature and the orientation strength.

Now, FIG. 10 shows a relation between the attained temperature in the second drying step and the (100) plane orientation strength. The data herein represent a case where 2-n-butoxyethanol having the boiling point of 176 degrees C. is used as the solvent which is the main solvent of the sol and the piezoelectric precursor films are dried by use of a baking device.

As shown in FIG. 10, when the second drying step is executed by use of the baking device, the (100) orientation strength gradually increases at a temperature around 170 degrees C. and reaches a peak when the temperature slightly exceeds the boiling point (176 degrees C.) of the solvent by means of raising the temperature to be attained in the second drying step. Then the orientation strength suddenly drops at a temperature around 190 degrees C. Meanwhile, occurrence of tarnish is observed outwardly when the temperature to be attained is set to 180 degrees C. or above. It is apparent from the foregoing that the crystal orientation of the piezoelectric layer can be controlled by adjusting the temperature to be attained in the second drying step. Particularly, in this embodiment, it is possible to orient the crystals of the piezoelectric layer 70 to the (100) plane of the rhombohedral system by raising the temperature to be attained in the second drying step to a temperature higher than the boiling point of the solvent which is the main solvent of the sol. However, if the temperature to be attained is set too high in the second drying step, the (100) plane orientation strength is reduced due to factors such as a chemical reaction caused by the solvent. Accordingly, it is preferable to set the temperature to be attained in the second drying step 201 to a temperature slightly higher than the boiling point of the solvent.

Figure 11:
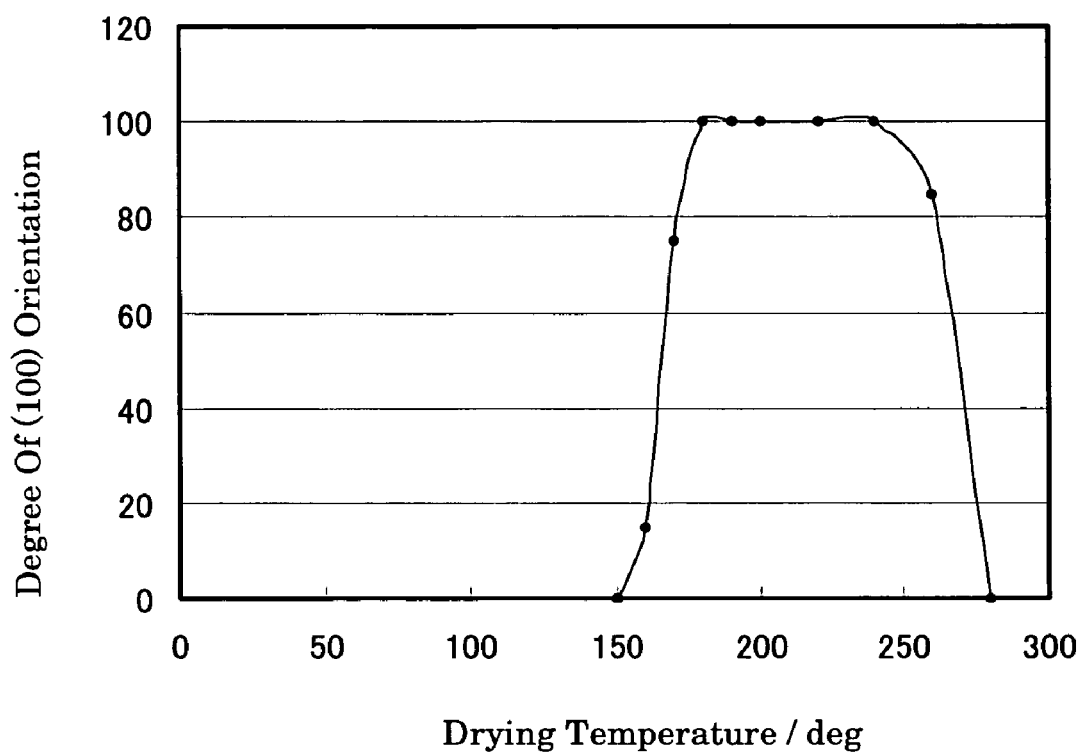
FIG. 11 is a graph showing a relation between the drying temperature and a degree of orientation.

Although the data in FIG. 10 represent the case of drying the piezoelectric precursor films 71 by use of the baking device, the relation between the attained temperature and the crystal orientation in the second drying step turns out to be different when drying the piezoelectric precursor films 71 by use of a clean oven. FIG. 11 shows a relation between the attained temperature and a degree of (100) orientation in a case of executing the second drying step by use of the clean oven. Here, the "degree of orientation" means a ratio of diffraction intensity generated when the piezoelectric layer is measured by use of a wide angle X-ray diffraction method. Specifically, when the piezoelectric layer is measured in accordance with the wide angle X-ray diffraction method, peaks of diffraction intensity corresponding to the (100) plane, the (110) plane, and the (111) plane are observed. The "degree of (100) orientation" means a ratio of the peak intensity corresponding to the (100) plane relative to the sum of the peak intensities corresponding to the respective planes.

As shown in FIG. 11, when the second drying step is executed by use of the clean oven, the degree of (100) orientation gradually increases by means of raising the attained temperature in the second drying step, and reaches nearly 100% when the temperature is equal to or above the boiling point (176 degrees C.) of the solvent. Then the degree of (100) orientation drops when the temperature exceeds 250 degrees C.

It is apparent from the foregoing that the crystal orientation of the piezoelectric layer can be controlled by adjusting the temperature to be attained in the second drying step, although the appropriate temperature range may vary depending on the heating device used in the second drying step. Particularly, it is possible to form the favorable piezoelectric layer by raising the temperature slightly higher than the boiling point of the solvent.

Figure 12:
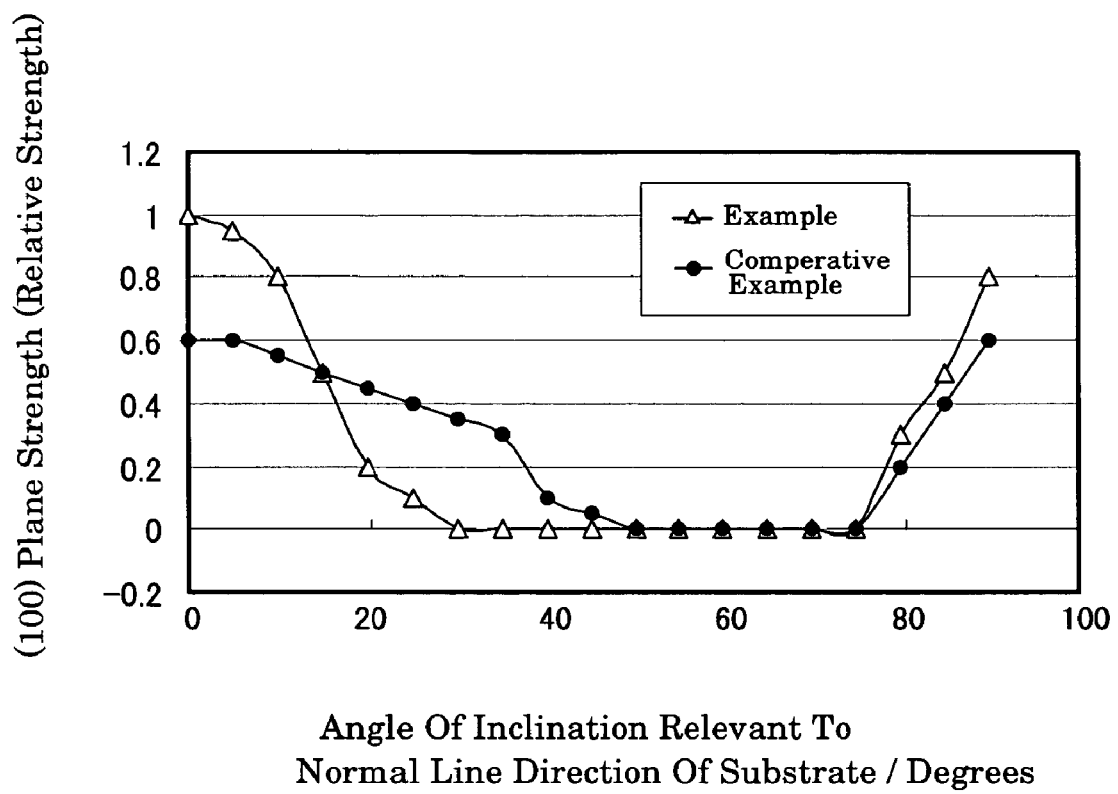
FIG. 12 is a graph showing a relation between an inclination of a (100) plane and the orientation strength.

Moreover, according to the manufacturing method of the present invention, it is also possible to enhance electrical characteristics of the piezoelectric layer 70 by executing the second drying step. Here, a piezoelectric layer (Example) subjected to the second drying step (at 180 degrees C. for 10 minutes) and a piezoelectric layer (Comparative Example) not subjected to the second drying step are formed on each certain substrate, and a relation between an inclination of the (100) plane relative to a surface of the substrate and the (100) plane orientation strength is examined in terms of each of the piezoelectric layers. The result is shown in FIG. 12. Here, the X-axis of the graph shown in FIG. 12 represents the angle of inclination in a normal line direction of the (100) plane of the piezoelectric layer relative to the surface of the substrate.

As shown in FIG. 12, when the angle of inclination is 90 degrees and the (100) plane of each of the piezoelectric layers is almost parallel to the surface of the substrate, the piezoelectric layer of the Example shows the (100) plane orientation strength higher than that of the piezoelectric layer of the Comparative Example. Therefore, it can be said that the piezoelectric layer of the Example has smaller deviation between a direction of an electric field upon application of a voltage to the piezoelectric layer and a direction of a polarization axis as compared to the piezoelectric layer of the Comparative Example. That is, it is apparent from the foregoing that the electrical characteristics of the piezoelectric layer 70 can be enhanced by executing the second drying step.

Figure 13A:
FIGS. 13A and 13B are scanning electron microscopic images showing crystalline states of a piezoelectric layer.
Figure 13B:
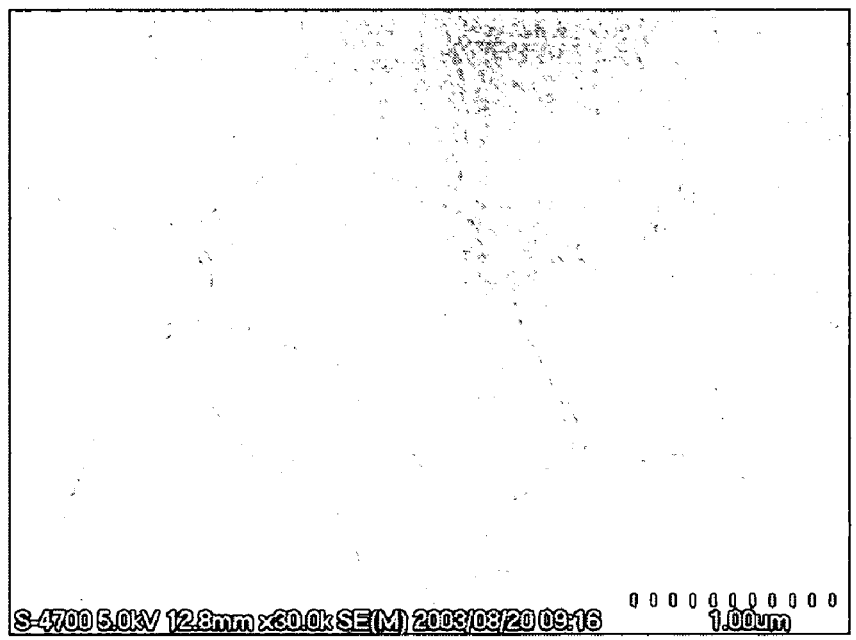

In addition, it is possible to control grain sizes of the piezoelectric layer 70 by adjusting an initial rate of temperature rise in the second drying step 201. Here, the initial rate of temperature rise is a rate of temperature rise in the beginning of heating, or more precisely at least in the first 1 minute of rise time. For example, when using ethanol having a boiling point of 7-8 degrees C. as the main solvent of the sol, the grain sizes become equal to or less than 500 nm as shown in a scanning electron microscopic (SEM) image in FIG. 13A by setting the rate of initial temperature rise in the second drying step 201 equal to or below 70 degrees C./min. Meanwhile, when the initial rate of temperature rise is set equal to or above 100 degrees C./min, the majority of the grain sizes become equal to or above 1000 nm as shown in an SEM image in FIG. 13B. Here, the grain sizes mean the width of the grains in terms of a plane direction which is parallel to the substrate.

Figure 14:
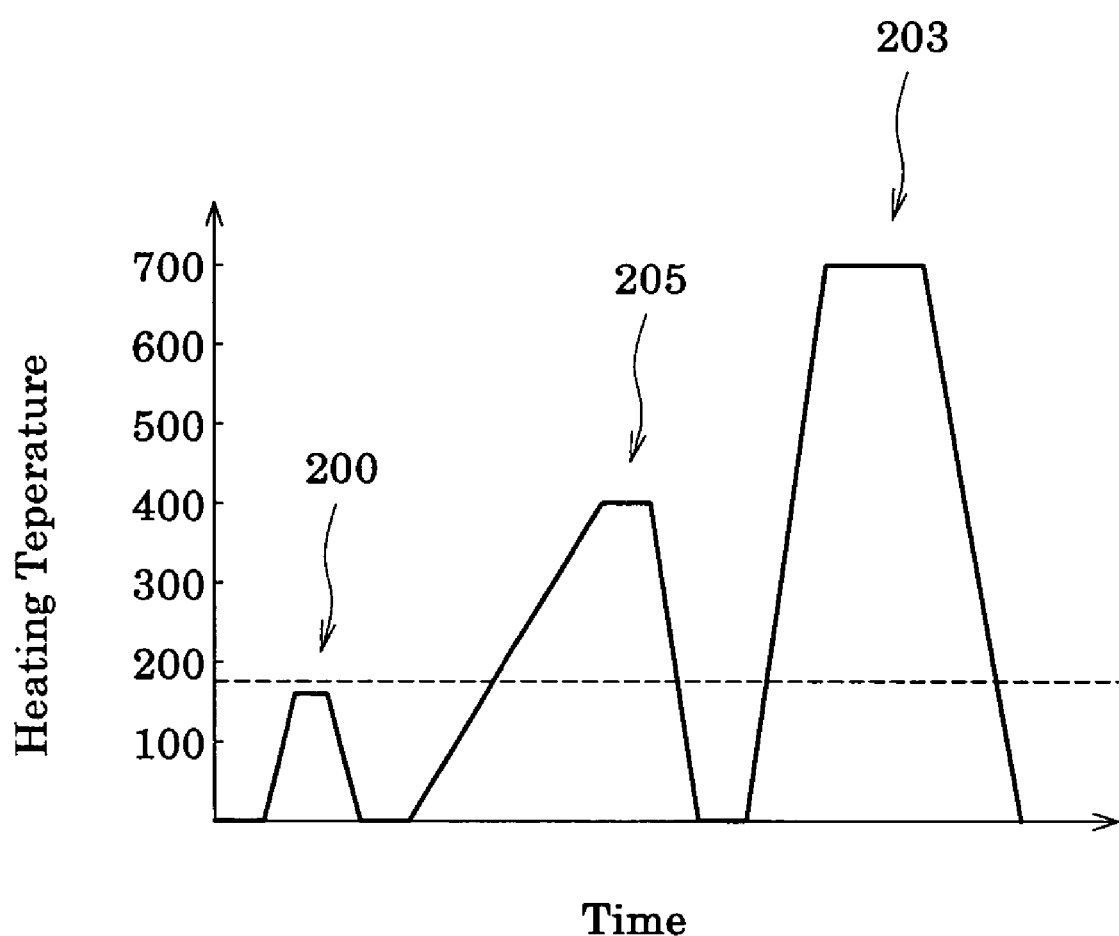
FIG. 14 is a graph showing an example of the temperature profile.

By controlling the grain sizes of the piezoelectric layer 70 as described above, it is possible to control mechanical characteristics of the piezoelectric layer 70 such as Young's modulus. In addition, by controlling density of crystal grain boundary in the piezoelectric layer 70, it is also possible to control a coercive electric field which depends on density of grain boundary. Accordingly, the piezoelectric element 300 having a desired displacement characteristic can be formed. Note that it is also possible to form the piezoelectric layer 70 by executing a heating process including three steps of the first drying step 200, a degreasing step 205 which also serves as the second drying step, and the baking step 203 as shown in FIG. 14, for example, instead of executing the first drying step 200, the second drying step 201, the degreasing step 202, and the baking step 203 independently. Nevertheless, when the piezoelectric layer 70 is formed by the heating process including the above-described three steps, it is difficult to control the grain sizes of the piezoelectric layer 70. In addition, it is also difficult to control the orientation of the crystals of the piezoelectric layer 70. For example, if the piezoelectric layer adopts the rhombohedral system as described in this embodiment, the crystals are oriented to the (111) plane in which it is difficult to obtain sufficient piezoelectric characteristics as compared to the (100) plane.

Figure 15:
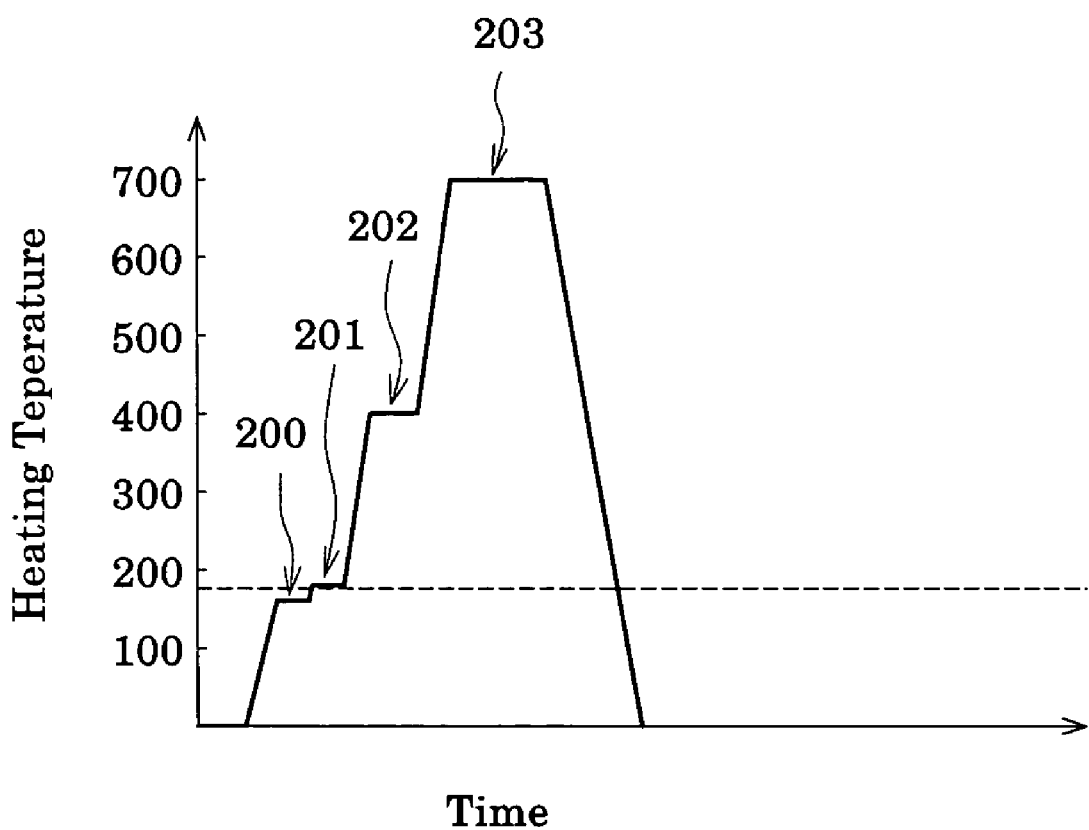
FIG. 15 is a graph showing another example of the temperature profile.

In this embodiment, the piezoelectric layer 70 is formed by performing the first drying step 200, the second drying step 201, the degreasing step 202, and the baking step 203 independently as shown in FIG. 7. However, the present invention is not limited to the foregoing. For example, as shown in FIG. 15, it is also possible to perform continuous heating throughout the first and second drying steps 200 and 201, the degreasing step 202, and the baking step 203 without lowering the temperature in the consecutive steps. Specifically, as shown in FIG. 15, it is possible to perform continuous heating in the second drying step 201 starting from the processing temperature for the first drying step 200 to the processing temperature for the second drying step 201. Moreover, it is possible to perform continuous heating in the degreasing step 202 starting from the processing temperature for the second drying step 201 to the processing temperature for the degreasing step 202. Furthermore, it is possible to perform continuous heating in the baking step 203 starting from the processing temperature for the degreasing step 202 to the processing temperature for the baking step 203.

A rapid thermal processing (RTP) device configured to perform heating by irradiation with an infrared lamp may be used as a heating device which can perform continuous heating in the respective steps of the first and second drying steps 200 and 201, the degreasing step 202, and the baking step 203 without lowering the processing temperature between a precedent step and a subsequent step. This RTP device can control the rate of temperature rise freely from 0 to 15 degrees C./sec in a temperature range from a room temperature to about 800 degrees C., thus satisfying the heating conditions for the first and second drying steps 200 and 201, the degreasing step 202, and the baking step 203.

As described above, by performing the continuous heating in the consecutive steps of the first and second drying steps 200 and 201, the degreasing step 202, and the baking step 203 without lowering the temperature, it is not necessary to again perform heating in the subsequent step to achieve the process temperature of the preceding step. Accordingly, it is possible to shorten time for the heat treatment in the respective steps and to reduce manufacturing costs without wasting energy for the heating. Moreover, by using the same heating device throughout the steps, it is possible to omit the work for moving the passage-forming substrate wafer 110 to a different device. By simplifying the work, it is possible to enhance productivity.

Figure 16:
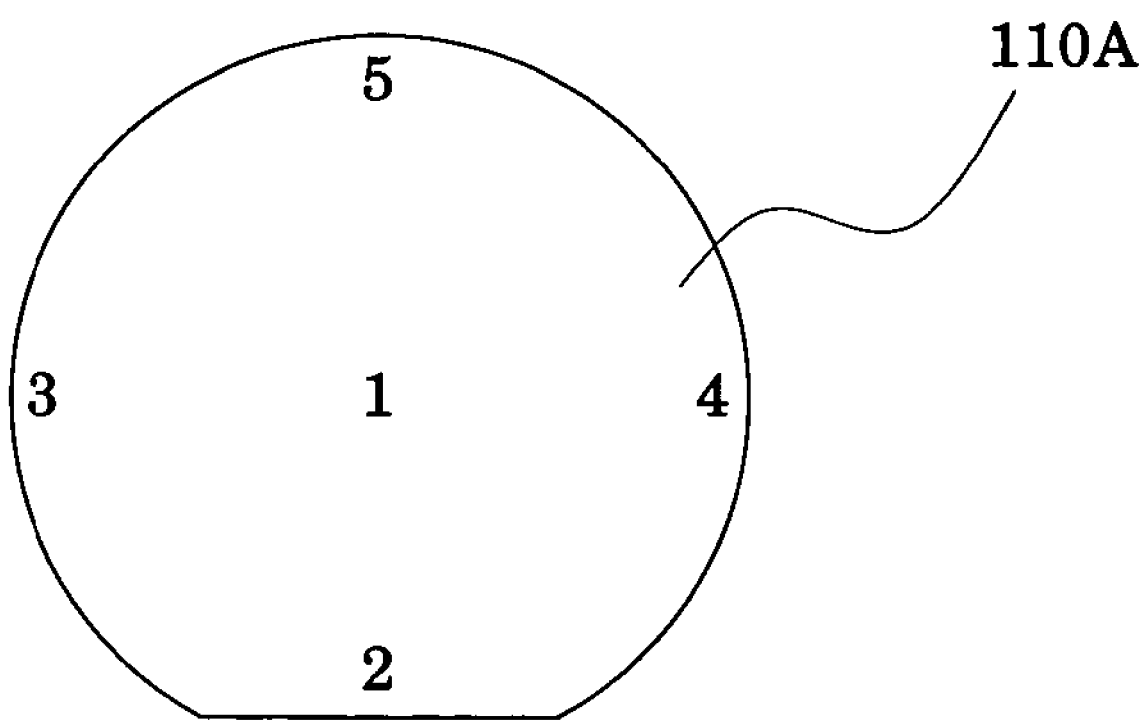
FIG. 16 is a view showing positions of temperature measurement in terms of the in-plane direction of the wafer.
Figure 17A:
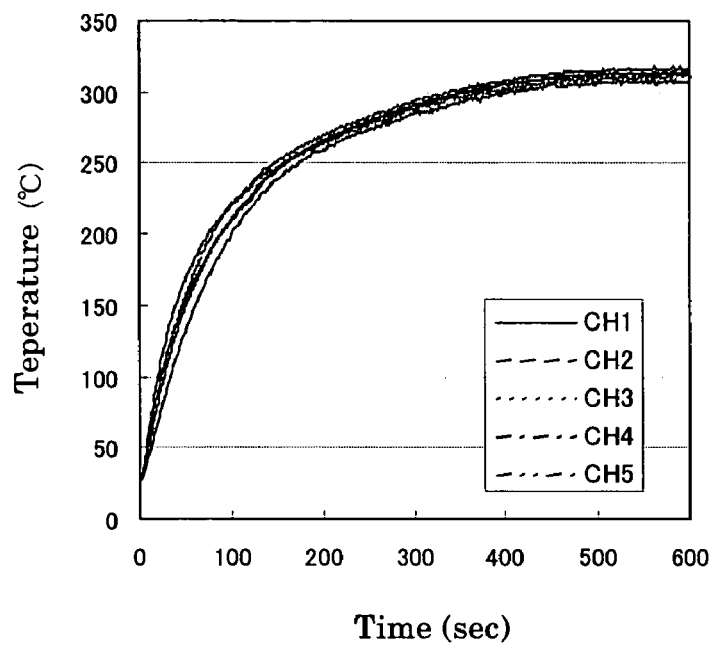
FIGS. 17A and 17B are graphs showing unevenness in the temperature in terms of the in-plane direction of the wafer.
Figure 17B:
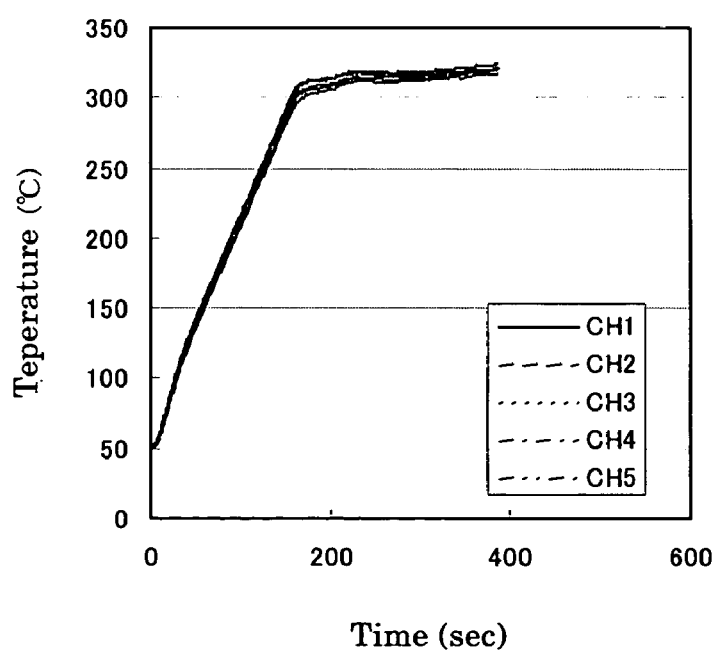

Here, actual temperatures and variations thereof in predetermined positions in an in-plane direction of a thermocouple instrumented wafer are examined in terms of two cases of heating the thermocouple instrumented wafer with the hot plate and of heating the thermocouple instrumented wafer with the RTP device. To be more precise, the degreasing step is performed, in which the thermocouple instrumented wafers are heated from room temperature to 320 degrees C. by using the hot plate and the RTP device, respectively. Then, the actual temperatures in the predetermined positions 1 to 5 in terms of the in-plane direction of the thermocouple instrumented wafer 110A are measured at 200 degrees C. in the course of heating and at the attained temperature of 320 degrees C. as shown in FIG. 16. Results are shown in FIGS. 17A and 17B. Here, FIG. 17A is a graph showing the temperatures in the case of heating the thermocouple instrumented wafer with the hot plate, and FIG. 17B is a graph showing the temperatures in the case of heating the thermocouple instrumented wafer with the RTP device.

As shown in FIG. 17A, when the thermocouple instrumented wafer 110A is heated with the hot plate, the temperature variations in terms of the in-plane direction at 200 degrees C. in the course of heating and at the attained temperature of 320 degrees C. are about 24 degrees C. and about 10 degrees C., respectively. On the contrary, as shown in FIG. 17B, when the thermocouple instrumented wafer 110A is heated with the RTP device, the temperature variations in terms of the in-plane direction at 200 degrees C. in the course of heating and at the attained temperature of 320 degrees C. are about 8 degrees C. and about 6 degrees C., respectively. Accordingly, by executing the heat treatment with the RTP device, it is possible to enhance uniformity of the heat on the wafer and thereby to obtain uniform characteristics in terms of the in-plane direction of the piezoelectric layer 70.

Note that it is not always necessary to perform the continuous heating throughout the consecutive steps of the first and second drying steps 200 and 201, the degreasing step 202, and the baking step 203 without lowering the temperature as described above. Instead, the continuous heating may be performed in at least two consecutive steps among the first drying step 200, the second drying step 201, the degreasing step 202, and the baking step 203 without lowering the temperature. For example, in case of repeating the cycle from the coating step to the degreasing step 202 twice and then executing the baking step 203 as described in the embodiment, it is possible to perform the continuous heating from the first drying step 200 to the degreasing step 202 in the first cycle without lowering the temperature, then to perform the coating step after cooling down to a room temperature, and then to perform the continuous heating from the first drying step 200 to the baking step 203 in the second cycle without lowering the temperature. In this case as well, it is also possible to shorten time for the heat treatment and to reduce manufacturing costs.

Figure 5A:
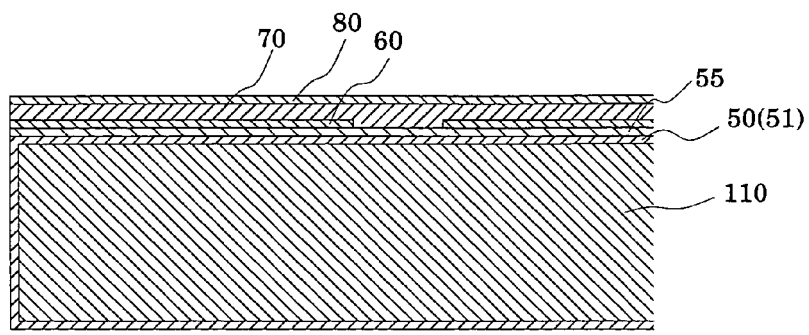
FIGS. 5A to 5D are cross-sectional views showing the manufacturing process of the recording head according to Embodiment 1.
Figure 5B:
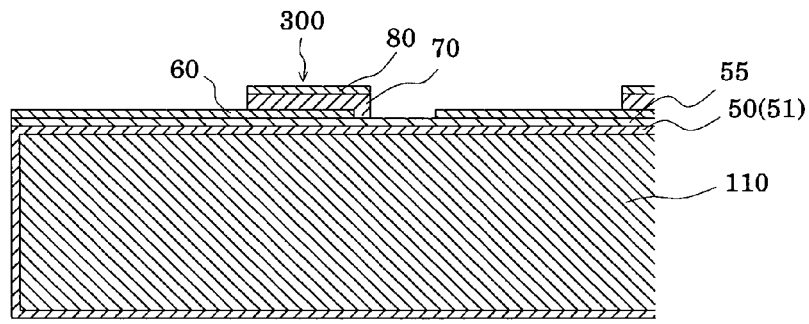
Figure 5C:
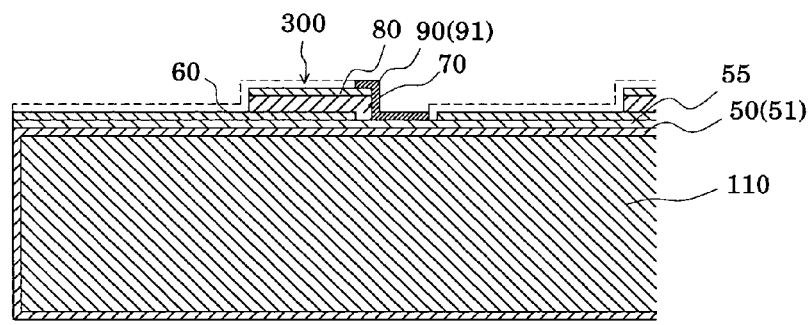

After forming the piezoelectric layer 70 as described above, the upper electrode film 80 made of iridium, for example, is formed on the entire surface of the passage-forming substrate wafer 110 as shown in FIG. 5A. Subsequently, as shown in FIG. 5B, the piezoelectric layer 70 and the upper electrode film 80 are patterned into a region corresponding to each of the respective pressure generating chambers 12 to form the piezoelectric element 300. Next, the lead electrode 90 is formed. To be more precise, a metal layer 91 made of gold (Au) or the like, for example, is formed on the entire surface of the passage-forming substrate wafer 110 as shown in FIG. 5C. Thereafter, the lead electrodes 90 are formed in conformity to the respective piezoelectric elements 300 by patterning the metal layer 91 through a mask pattern (not shown) made of resist or the like, for example.

Figure 5D:
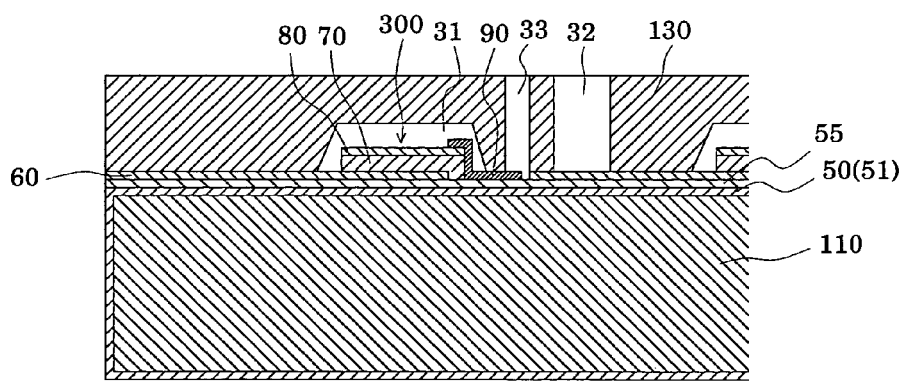

Next, as shown in FIG. 5D, a protective plate wafer 130 made of a silicon wafer and constituting a plurality of protective plates 30 is joined to the piezoelectric element 300 side of the passage-forming substrate wafer 110. Here, this protective plate wafer 130 has a thickness of about 400 µm, for example. Accordingly, the stiffness of the passage-forming substrate wafer 110 is significantly enhanced by joining the protective plate wafer 130 thereto.

Figure 6A:
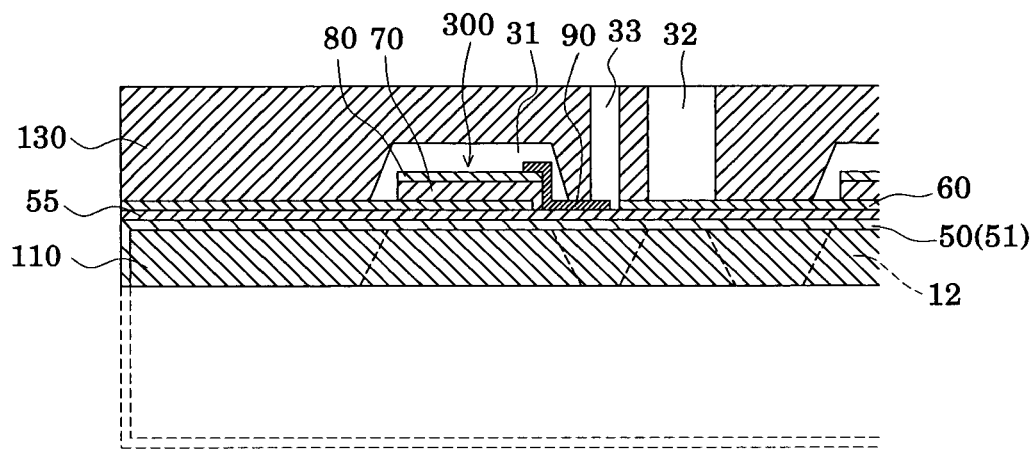
FIGS. 6A to 6C are cross-sectional views showing the manufacturing process of the recording head according to Embodiment 1.
Figure 6B:
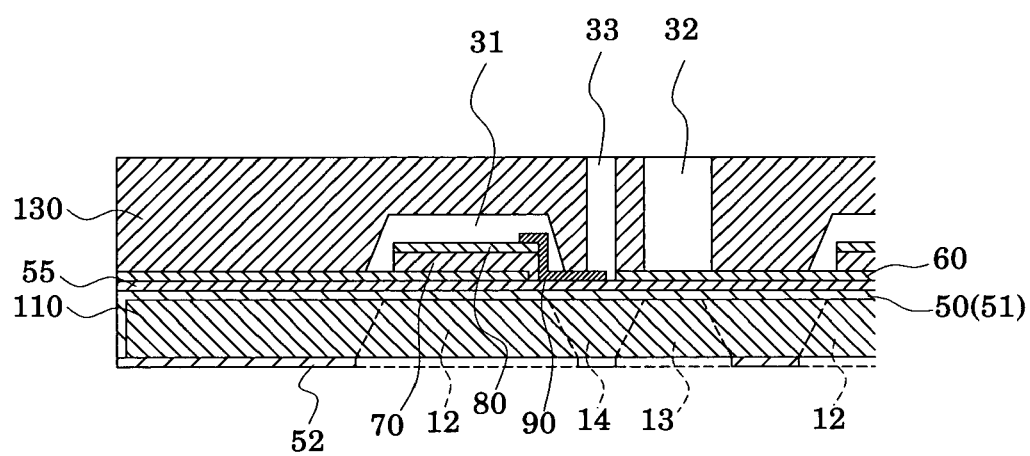
Figure 6C:
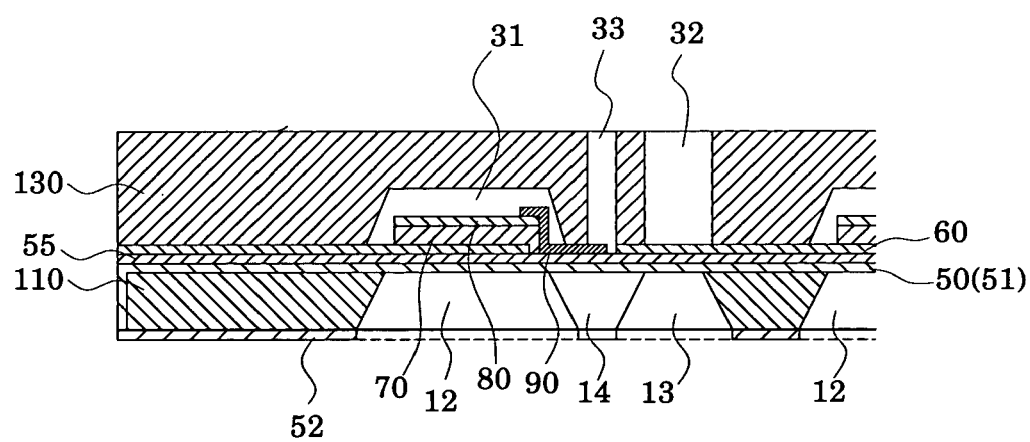

Subsequently, the passage-forming substrate wafer 110 is ground to a certain thickness as shown in FIG. 6A. Thereafter, the passage-forming substrate wafer 110 is further adjusted to a predetermined thickness by performing wet etching with hydrofluoric acid. For example, the passage-forming substrate wafer 110 is etched to adjust the thickness to about 70 µm in this embodiment. Subsequently, as shown in FIG. 6B, a mask film 52 made of silicon nitride (SiN), for example, is newly formed on the passage-forming substrate wafer 110, and the mask film 52 is patterned into a predetermined shape. Then, the passage-forming substrate wafer 110 is subjected to anisotropic etching through this mask film 52, whereby the pressure generating chambers 12, the communicating portion 13, the ink supply paths 14, and the like are formed on the passage-forming substrate wafer 110 as shown in FIG. 6C.

Thereafter, unnecessary portions in the periphery portions of the passage-forming substrate wafer 110 and of the protective plate wafer 130 are cut out and removed by dicing or the like. Then, the nozzle plate 20 having the nozzle orifices 21 drilled thereon is joined to the passage-forming substrate wafer 110 on the opposite surface to the protective plate wafer 130. In addition; the compliance plate 40 is joined to the protective plate wafer 130, and then the passage-forming substrate wafer 110 and other constituents thereon are divided into the passage-forming substrates 10 each having one chip size as shown in FIG. 1. In this way, the inkjet recording head of this embodiment is formed.

Other Embodiments

The present invention has been described above based on a certain embodiment. However, the present invention will not be limited only to the foregoing embodiment. Moreover, although the above embodiment has described the present invention based on the inkjet recording head as an example, it is by all means possible to apply the present invention to elements configured to eject liquids other than ink. Such liquid jet heads may include various recording head used in image recording devices such as printers, coloring material jet heads used for manufacturing color filters for liquid crystal displays and the like, electrode material jet heads used for forming electrodes such as in organic electroluminescence (EL) displays or field emission displays (FEDs), living organic material jet heads used in manufacturing biochips, and the like.

Moreover, the present invention is not limited only to the method of manufacturing a liquid jet head including a piezoelectric element. In other words, it is needless to say that the present invention is not limited only to the method of manufacturing a piezoelectric layer made of a piezoelectric material, but is applicable when manufacturing a dielectric film made of any kinds of dielectric materials.

What is claimed is:

1. A method of manufacturing a dielectric film comprising:
   forming a dielectric precursor film by coating sol made of an organic metal compound on a lower layer;
   drying the dielectric precursor film;
   degreasing the dielectric precursor film; and
   baking the dielectric precursor film for crystallization to form a dielectric film,
   wherein the drying includes:
   a first drying the dielectric precursor film by heating the dielectric precursor film to a temperature lower than a boiling point of a solvent which is a main solvent of the sol and then holding the dielectric precursor film at the temperature for a predetermined period of time;
   a second drying the dielectric precursor film further by reheating the dielectric precursor film and then holding the dielectric precursor film at the temperature for another predetermined period of time, and
   wherein a rate of temperature rise in the degreasing is the range from 0.5 to 1.5 (degrees C./sec),
   wherein a temperature to be attained in the degreasing is higher by a temperature selected from a range from 100 degrees C. to 300 degrees C. than the boiling point of the solvent which is the main solvent of the sol, and
   wherein a temperature of the baking is 680 degrees C. or above.

2. The method of manufacturing a dielectric film according to claim 1,
   wherein the method comprises the first drying, the second drying, the degreasing, and the baking independently.

3. The method of manufacturing a dielectric film according to claim 1,
   wherein the temperature in at least two consecutive operations among the first drying, the second drying, the degreasing, and the baking is not lowering.

4. The method of manufacturing a dielectric film according to claim 3,
   wherein the temperature in consecutive operations of the first and second drying, the degreasing, and the baking is not lowering.

5. The method of manufacturing a dielectric film according to claim 3,
   wherein at least two consecutive operations out of the first drying, the second drying, the degreasing, and the baking are performed by use of a rapid thermal processing device.

6. The method of manufacturing a dielectric film according to claim 1,
   wherein crystals of the dielectric film are subjected to preferred orientation along a (100) plane of a rhombohedral system by adjusting a temperature to be attained in the second drying.

7. The method of manufacturing a dielectric film according to claim 1,
   wherein grain sizes of crystals of the dielectric film are controlled by adjusting a rate of temperature rise in the second drying.

8. The method of manufacturing a dielectric film according to any of claims 1 to 7,
   wherein the dielectric precursor film is baked to a temperature higher by at least 400 degrees C. than the boiling point of the solvent in the baking.

* * * * *